United States Patent
Jeon et al.

(10) Patent No.: US 12,471,204 B2
(45) Date of Patent: Nov. 11, 2025

(54) SEMICONDUCTOR DEVICE MODULES

(71) Applicant: SEMICONDUCTOR COMPONENTS INDUSTRIES, LLC, Phoenix, AZ (US)

(72) Inventors: Oseob Jeon, Seoul (KR); Seungwon Im, Bucheon (KR); Roveendra Paul, Dublin, CA (US); Jerome Teysseyre, Scottsdale, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 365 days.

(21) Appl. No.: 18/154,303

(22) Filed: Jan. 13, 2023

(65) Prior Publication Data

US 2023/0225044 A1    Jul. 13, 2023

Related U.S. Application Data

(60) Provisional application No. 63/299,147, filed on Jan. 13, 2022.

(51) Int. Cl.
  *H05K 1/02* (2006.01)
  *H03K 17/687* (2006.01)
  *H05K 1/18* (2006.01)

(52) U.S. Cl.
  CPC ....... *H05K 1/0216* (2013.01); *H03K 17/6871* (2013.01); *H05K 1/181* (2013.01);
  (Continued)

(58) Field of Classification Search
  CPC .......... H05K 1/02; H05K 1/0216; H05K 1/18; H05K 1/181–187; H01L 23/3121;
  (Continued)

(56) References Cited

U.S. PATENT DOCUMENTS 7,759,778 B2    7/2010 Lowry et al.
9,214,415 B2    12/2015 Denison et al.
(Continued)

FOREIGN PATENT DOCUMENTS

EP    2015626 A2    1/2009
EP    2725699 A1    4/2014
(Continued)

OTHER PUBLICATIONS

Extended European Search Report for European Application No. 18157477.3, mailed Jul. 19, 2018, 10 pages.
(Continued)

*Primary Examiner* — Tuan T Dinh
(74) *Attorney, Agent, or Firm* — Brake Hughes Bellerman LLP (57) ABSTRACT

In general aspect, a module can include a substrate having a semiconductor circuit implemented thereon, and a negative power supply terminal electrically coupled with the semiconductor circuit via the substrate. The negative power supply terminal includes a connection tab arranged in a first plane. The module also includes a first positive power supply terminal electrically and a second positive power supply terminal that are coupled with the semiconductor circuit via the substrate. The first positive power supply terminal being laterally disposed from the negative power supply terminal, and including a connection tab arranged in the first plane. The second positive power supply terminal is laterally disposed from the negative power supply terminal and arranged in the first plane, such that the negative power supply terminal is disposed between the first positive power supply terminal and the second positive power supply terminal.

21 Claims, 6 Drawing Sheets

(52) U.S. Cl.
CPC ............... *H03K 2217/0063* (2013.01); *H03K 2217/0072* (2013.01); *H05K 2201/10166* (2013.01)

(58) Field of Classification Search
CPC ............... H01L 23/3735; H01L 23/492; H01L 23/49827; H01L 23/5386
USPC .......... 361/775–778, 784, 803; 257/660–690
See application file for complete search history.

(56) References Cited

U.S. PATENT DOCUMENTS

| | | |
|---|---|---|
| 10,090,279 B2 | 10/2018 | Im et al. |
| 11,031,379 B2 | 6/2021 | Im et al. |
| 2008/0164590 A1 | 7/2008 | Xiaochun et al. |
| 2009/0116197 A1 | 5/2009 | Funakoshi et al. |
| 2009/0230536 A1 | 9/2009 | Liu et al. |
| 2010/0237507 A1 | 9/2010 | Yamada et al. |
| 2013/0001759 A1 | 1/2013 | Kim et al. |
| 2013/0043593 A1 | 2/2013 | Domes |
| 2013/0062751 A1 | 3/2013 | Takagi et al. |
| 2014/0117523 A1 | 5/2014 | Ho et al. |
| 2014/0291696 A1 | 10/2014 | Horimoto et al. |
| 2015/0131232 A1 | 5/2015 | Ishino et al. |
| 2016/0079142 A1 | 3/2016 | Hasegawa et al. |
| 2016/0308456 A1 | 10/2016 | Nakatsu et al. |
| 2017/0237311 A1 | 8/2017 | Sakai et al. |
| 2018/0122720 A1 | 5/2018 | Hable et al. |
| 2018/0175010 A1* | 6/2018 | Lee ..................... H01L 23/5381 |
| 2019/0244888 A1 | 8/2019 | Kawashima |
| 2020/0053900 A1* | 2/2020 | Feurtado ............... H02M 7/537 |
| 2020/0135702 A1* | 4/2020 | Arai ..................... H01L 23/3735 |
| 2020/0365564 A1* | 11/2020 | Mari Curbelo ..... H01L 23/5386 |
| 2021/0125903 A1* | 4/2021 | Tani ........................ H01L 24/73 |

FOREIGN PATENT DOCUMENTS

| | | |
|---|---|---|
| EP | 3246945 A1 | 11/2017 |
| EP | 4261879 A1 | 10/2023 |
| JP | 2001326325 A | 11/2001 |
| JP | 2010016947 A | 1/2010 |
| WO | 2016017267 A1 | 2/2016 |
| WO | 2021130290 A1 | 7/2021 |

OTHER PUBLICATIONS

Power Electronic Systems Laboratory, "Ultra-Low-Inductance Power Module for Fast Switching Semiconductors," Proceedings of the PCIM Europe Conference for Power Electronics, Intelligent Motion, Renewable Energy and Energy Management Nuremberg, Germany, May 14-16, 2013.

The Partial European Search Report for counterpart EP Patent Application No. 23151438, mailed Jul. 5, 2023, 16 pages.

Extended European search report for counterpart European Patent Application No. 23151438.1.

\* cited by examiner

SEMICONDUCTOR DEVICE MODULES

RELATED APPLICATION

This application claims priority to and the benefit of U.S. Provisional Application No. 63/299,147, filed on Jan. 13, 2022, and entitled "MODULE HAVING BALANCED CURRENT DENSITY AND LOW STRAY INDUCTANCE," which is incorporated by reference herein in its entirety.

TECHNICAL FIELD

This description relates to semiconductor device assemblies. More specifically, this description relates to power semiconductor device modules.

BACKGROUND

Semiconductor devices (e.g., semiconductor die) can be included in package assemblies or modules, where such modules can include one or more semiconductor die (e.g., implemented in a circuit included in the module). The performance of semiconductor die, as well as an associated circuit in such modules can be adversely impacted by parasitic impedance, such as parasitic (stray) inductance. For instance, performance of power semiconductor devices in a power module can be affected by stray inductance resulting from magnetic fields associated with high currents conducted by those power semiconductor devices.

SUMMARY

In general aspect, a module can include a substrate having a semiconductor circuit implemented thereon, and a negative power supply terminal electrically coupled with the semiconductor circuit via the substrate. The negative power supply terminal includes a connection tab arranged in a first plane. The module also includes a first positive power supply terminal electrically and a second positive power supply terminal that are coupled with the semiconductor circuit via the substrate. The first positive power supply terminal being laterally disposed from the negative power supply terminal, and including a connection tab arranged in the first plane. The second positive power supply terminal is laterally disposed from the negative power supply terminal and arranged in the first plane, such that the negative power supply terminal is disposed between the first positive power supply terminal and the second positive power supply terminal.

Implementations can include one or more of the following features, alone or in combination. The first positive power supply terminal and the second positive power supply terminal can be electrically coupled with the semiconductor circuit via a patterned metal layer disposed on a surface of the substrate. The patterned metal layer can include a portion electrically coupling the first positive power supply terminal with the second positive power supply terminal. The surface of the substrate can define a second plane that is parallel to and non-coplanar with the first plane.

A line orthogonal to the first plane and the second plane can intersect the negative power supply terminal and the portion of the portion of the patterned metal layer electrically coupling the first positive power supply terminal with the second positive power supply terminal.

The connection tab of the negative power supply terminal, the connection tab of the first positive power supply terminal and the connection tab of the second positive power supply terminal can be disposed external to an encapsulation material of the module along a same edge of the module. The capsulation material can encapsulate the semiconductor circuit and at least a portion of the substrate.

The semiconductor circuit can be a half-bridge circuit. The negative power supply terminal can be electrically coupled with a low-side switch of the half-bridge circuit, and the first positive power supply terminal and the second positive power supply terminal can be electrically coupled in parallel with each other and electrically coupled with a high-side switch of the half-bridge circuit.

The low-side switch can include a first plurality of vertical power transistors electrically coupled in parallel with each other. The high-side switch can include a second plurality of vertical power transistors electrically coupled in parallel with each other.

The module can include an encapsulation material that encapsulates the semiconductor circuit and encapsulates at least a portion of the substrate. The connection tab of the negative power supply terminal, the connection tab of the first positive power supply terminal and the connection tab of the second positive power supply terminal can each extend out of the encapsulation material along respective longitudinal axes that are orthogonal to a same edge of the encapsulation material, the connection tab of the negative power supply terminal can have a first width along a line orthogonal to its respective longitudinal axis. The connection tab of the first positive power supply terminal and the connection tab of the second positive power supply terminal can each have a second width along a line orthogonal to their respective longitudinal axes. The second width can be less than the first width.

The connection tab of the negative power supply terminal can a first width along a line orthogonal to its respective longitudinal axis, the connection tab of the first positive power supply terminal can have a second width along a line orthogonal to its respective longitudinal axis, the second width being less than the first width. The connection tab of the second positive power supply terminal can have a third width along a line orthogonal to its respective longitudinal axis, the third width being less than the second width.

The connection tab of the negative power supply terminal, the connection tab of the first positive power supply terminal and the connection tab of the second positive power supply terminal can be disposed along a first edge of the module. The module can include an output terminal electrically coupled with the semiconductor circuit via the substrate. The output terminal can have a connection tab arranged in the first plane. The connection tab of the output terminal can be disposed along a second edge of the module opposite the first edge.

The semiconductor circuit can be a half-bridge circuit. The output terminal can be electrically coupled with an output node of the half-bridge circuit.

The substrate can be a direct-bonded-metal substrate.

The negative power supply terminal can include a first protrusion extending toward the first positive power supply terminal, and a second protrusion extending toward the second positive power supply terminal. The first positive power supply terminal can include a protrusion extending toward the negative power supply terminal that is parallel and coplanar with the first protrusion of the negative power supply terminal. The second positive power supply terminal can include a protrusion extending toward the negative power supply terminal that is parallel and coplanar with the second protrusion of the negative power supply terminal.

In another general aspect, a module includes a substrate having a half-bridge circuit implemented thereon. The half-bridge circuit includes a plurality of high-side power semiconductor switches electrically coupled in parallel, and a plurality of low-side power semiconductor switches electrically coupled in parallel. The module also includes a negative power supply terminal electrically coupled with the plurality of low-side power semiconductor switches. The negative power supply terminal includes a connection tab arranged in a first plane. The module further includes a first positive power supply terminal and a second positive power supply terminal that are electrically coupled with the plurality of high-side power semiconductor switches. The first positive power supply terminal is laterally disposed from the negative power supply terminal along a first edge of the substrate. The first positive power supply terminal includes a connection tab arranged in the first plane. The second positive power supply terminal is laterally disposed from the negative power supply terminal along the first edge of the substrate. The second positive power supply terminal is arranged in the first plane. The negative power supply terminal being is disposed between the first positive power supply terminal and the second positive power supply terminal.

Implementations can include one or more of the following features, alone or in combination. For example, the first positive power supply terminal and the second positive power supply terminal can be electrically coupled with the plurality of high-side power semiconductor switches via a patterned metal layer disposed on a surface of the substrate. The patterned metal layer can include a portion electrically coupling the first positive power supply terminal with the second positive power supply terminal. The surface of the substrate can define a second plane that is parallel to and non-coplanar with the first plane. A line orthogonal to the first plane and the second plane can intersects the negative power supply terminal and the portion of the portion of the patterned metal layer electrically coupling the first positive power supply terminal with the second positive power supply terminal.

The module can include an output terminal electrically coupled with an output node of the half-bridge circuit. The output terminal can include a connection tab arranged in the first plane. The connection tab of the output terminal can be disposed along a second edge of the substrate opposite the first edge.

The substrate can include a patterned metal layer of the half-bridge circuit. The patterned metal layer can be symmetric along a center line of the substrate extending from the first edge of the substrate to the second edge of the substrate.

The plurality of high-side power semiconductor switches can include a first column of high-side power semiconductor switches arranged along a third edge of the substrate, and a second column of high-side power semiconductor switches arranged along a fourth edge of the substrate. The third edge of the substrate can be orthogonal to the first edge of the substrate and a second edge of the substrate opposite the first edge of the substrate. The fourth edge of the substrate can be orthogonal to the first edge and the second edge of the substrate. The plurality of low-side power semiconductor switches can be arranged in a first column of low-side power semiconductor switches arranged in parallel with and adjacent to the first column of high-side switches, and a second column of low-side power semiconductor switches arranged in parallel with and disposed between the first column of low-side switches and the second column of high-side switches.

An arrangement of the first column of high-side power semiconductor switches and the first column of low-side power semiconductor switches can be symmetrical with an arrangement of the second column of high-side power semiconductor switches and the second column of low-side semiconductor switches.

The plurality of high-side power semiconductor switches can be arranged in a first column of high-side power semiconductor switches arranged along a third edge of the substrate, and a second column of high-side power semiconductor switches arranged in parallel with and adjacent to the first column of high-side power semiconductor switches. The third edge of the substrate can be orthogonal to the first edge of the substrate and a second edge of the substrate opposite the first edge. The plurality of low-side power semiconductor switches can be arranged in a first column of low-side power semiconductor switches arranged along a fourth edge of the substrate, and a second column of low-side power semiconductor switches arranged in parallel with and disposed between the first column of low-side switches and the second column of high-side switches. The fourth edge of the substrate can be orthogonal to the first edge and the second edge of the substrate.

The negative power supply terminal can include a first protrusion extending toward the first positive power supply terminal, and a second protrusion extending toward the second positive power supply terminal. The first positive power supply terminal can include a protrusion extending toward the negative power supply terminal that is parallel and coplanar with the first protrusion of the negative power supply terminal. The second positive power supply terminal can include a protrusion extending toward the negative power supply terminal that is parallel and coplanar with the second protrusion of the negative power supply terminal.

Like reference symbols in the various drawings indicate like elements. Reference numbers for some like elements may not be repeated for all such elements. In certain instances, different reference numbers may be used for like, or similar elements. Some reference numbers for certain elements of a given implementation may not be repeated in each drawing corresponding with that implementation. Some reference numbers for certain elements of a given implementation may be repeated in other drawings corresponding with that implementation, but may not be specifically discussed with reference to each corresponding drawing. The drawings are for purposes of illustrating example implementations and may not necessarily be to scale.

DETAILED DESCRIPTION

This disclosure relates to packaged semiconductor device apparatus, which can be referred to as modules, semiconductor device modules, power semiconductor device modules, etc. The approaches illustrated and described herein can be used to implement semiconductor device modules that operate with reduced stray inductance as compared to prior implementations. Such stray inductance can be measured as a series inductance between power supply terminals, e.g., between a DC+ (positive) power supply terminal or terminals and a DC− (negative) power supply terminal or terminals. As indicated above, such stray inductance can be caused (e.g., during operation of a given device) by magnetic fields that are generated by currents flowing into and out of the power supply terminals, where magnetic field lines resulting from current associated with one power supply terminal are incident on a current path associated with another (e.g., coplanar) power supply terminal, and vice versa, result in parasitic (stray) inductance.

In the approaches described herein, reduced stray inductance (e.g., 15-50 percent reduction as compared to prior approaches) can be achieved as a result of implementing multiple positive power supply terminals (e.g., DC+ terminals) that are each laterally disposed from a negative supply terminal (e.g., a DC− terminal), e.g., laterally spaced on each side of the negative power supply terminal, such that respective current paths for the positive supply terminals and a current path for the negative power supply terminal are coplanar and in parallel with one another. That is, in the disclosed implementations, the current paths can be configured such that a direction of current flow associated with the positive power supply terminals is parallel with, and in an opposite direction of current flow associated with the negative power supply terminal. Such arrangements can reduce stray inductance of a power semiconductor device or module. For instance, such reductions in stray inductance can be realized as a result of mutual interference, or overlap between respective magnetic fields corresponding with currents associated with each of the positive power supply terminals and with a magnetic field corresponding with a current of the negative power supply terminal, causing those magnetic fields to, at least in part, cancel each other, thus reducing stray inductance.

Also, in example implementations described herein, further reductions in stray inductance can be achieved as result of internal routing, e.g., of metal layers on a substrate, of a semiconductor device module. For instance, routing of a metal layer corresponding with the positive power supply terminals can be arranged such that a portion of that metal layer overlaps with the negative power supply terminal, e.g., to achieve further cancellation of magnetic fields associated with respective currents corresponding with the positive power supply terminals and the negative power supply terminal. For instance, a metal layer corresponding with (electrically coupled with) the positive power supply terminals can include a portion that is, along a line intersecting both the negative power supply terminal and that portion of the metal layer, aligned with a corresponding portion of the negative power supply terminal. That is, in an example frame of reference, a portion of the metal layer associated with the positive power supply terminals can be vertically aligned with a corresponding potion of the negative power supply terminal.

Figure 1:
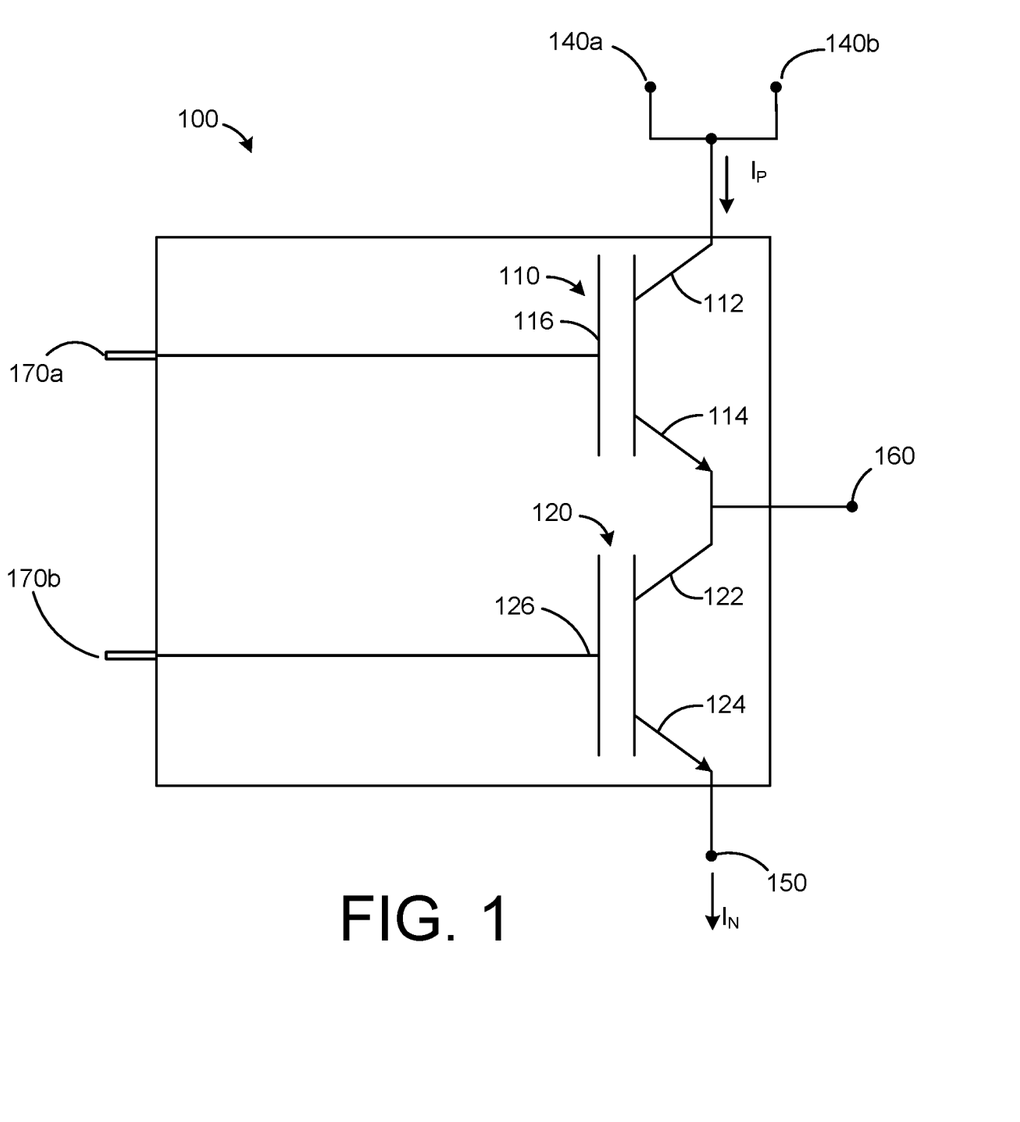
FIG. 1 is a schematic diagram illustrating an example power semiconductor circuit that can be included in a semiconductor device module, according to an implementation.

FIG. 1 is a schematic diagram illustrating a power semiconductor circuit (circuit 100) that can be included in a semiconductor device module, according to an implementation. In the circuit 100, a power transistor pair (switch pair, semiconductor switch pair, etc.), which can be referred to as a half-bridge circuit, is shown by way of example and for purposes of illustration. In other implementations, the approaches described herein can be used in conjunction with other semiconductor devices, other power semiconductor circuits, other semiconductor device modules, etc.

As shown in FIG. 1, the circuit 100 can include a first power semiconductor device or switch, a transistor 110, and a second power semiconductor device or switch, a transistor 120. The transistor 110 can be referred to as a high-side transistor of the half-bridge circuit, and the transistor 120 can be referred to as a low-side transistor of the half-bridge circuit. The transistor 110 and the transistor 120 can be implemented in one or more semiconductor die, for instance, the transistor 110 can be implemented in a first semiconductor die and the transistor and the transistor 120 can be implemented in a second semiconductor die. In the example FIG. 1, the transistor 110 and the transistor 120 are illustrated as insulated-gate bipolar transistors (IGBTs).

In some implementations, other types of power semiconductor devices could be used, such as power metal-oxide semiconductor field effect transistors (power MOSFETs). In some implementations, circuits having other arrangements (and functionality) could be implemented. In some implementations, the transistor 110 and transistor 120 can respectively include multiple transistors coupled in parallel with each other. For instance, the transistor 110 could include two or more power transistors (high-side transistors) coupled in parallel with each other, and the transistor 120 could include two or more power transistors (low-side transistors) coupled in parallel with each other.

In the circuit 100, the transistor 110 includes a collector 112, an emitter 114 and a gate 116. Likewise, the transistor 120 includes a collector 122, an emitter 124 and a gate 126. The emitter 114 of the transistor 110 and the collector 122 of the transistor 120 are electrically coupled to a common node of the circuit 100, on which an output signal (e.g., an alternating current signal for driving an electric motor of an electric vehicle) can be produced by the circuit 100. In implementations of the circuit 100 using power FETs for the transistor 110 and the transistor 120, the collector 112 and the collector 122 would be drains of respective FETs, and the emitter 114 and the emitter 124 would be sources of the respective FETs.

In the circuit 100, a positive power supply terminal 140a (e.g., a DC+ terminal, a Vdd terminal, etc.) and a positive power supplier terminal 140b can be coupled with the collector 112 of the transistor 110. A negative power supply terminal 150 (e.g., a DC− terminal, an electrical ground terminal, etc.) can be coupled with the emitter 124 of the transistor 120. In some implementations, such as those described herein, the negative power supply terminal 150 can be disposed between the positive power supply terminal 140a and the positive power supplier terminal 140b (e.g., along a same side or edge of a module) to provide for parallel current paths in opposite directions, such as for a positive supply current $I_P$ into the circuit 100 and a negative power supply current IN out of the circuit 100, as indicated in FIG. 1. Further, as described with respect to implementations disclosed herein, routing of a metal layer associated with the positive power supply terminal 140a and the positive power supplier terminal 140b can be arranged such that at least a portion of that metal layer overlaps with (e.g., is vertically aligned with) a corresponding portion of the negative power supply terminal 150.

Further, an output terminal 160 of the circuit 100 can be coupled with the common node of the emitter 114 of the transistor 110 and the collector 122 of the transistor 120. As described further below, the positive power supply terminal 140a, the positive power supplier terminal 140b, the negative power supply terminal 150 and the output terminal 160 can be implemented using metal terminals (copper terminals, metal leads) that are included in a packaged semiconductor device, each including a connection tab (or plate) that is external to an encapsulation material of an associated module. In some implementations, the positive power supply terminal 140a, the positive power supplier terminal 140b, the negative power supply terminal 150 and the output terminal 160 can be electrically and physically coupled with a substrate on which the circuit 100 is implemented. For instance, the positive power supply terminal 140a, the positive power supplier terminal 140b, the negative power supply terminal 150 and the output terminal 160 can be directly bonded (using direct-lead-attachment (DLA)) to the substrate, e.g., via respective leads of the terminals.

As further illustrated in FIG. 1, the circuit 100 can also include a plurality of signal leads that are electrically coupled with respective gate terminals of the transistor110 and the transistor 120. For instance, as shown in FIG. 1, a signal lead 170a can be electrically coupled with the gate 116 of the transistor 110, and a signal lead 170b can be electrically coupled with the gate 126 of the transistor 120. In other implementations, signal leads, such as the signal lead 170a and the signal lead 170b could be electrically (or operatively) coupled with other circuit elements, such as a control circuit (not shown) used to control operation of the half-bridge circuit. The particular signal leads (and connections to/from the signal leads) that are implemented in association with the circuit 100 will depend on the particular implementation, and the specific configuration of the circuit. As some examples, the signal leads can include gate control signal leads (e.g., as shown in FIG. 1), temperature sense signal leads, voltage sense signal leads, etc.

Figure 2:
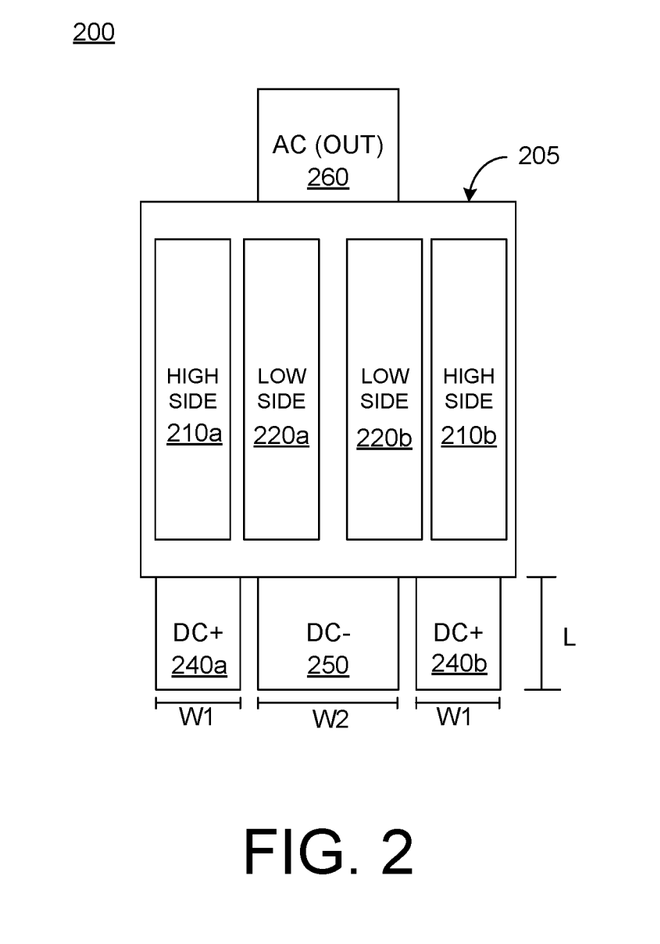
FIG. 2 is a block diagram illustrating an example semiconductor device module, according to an implementation.

FIG. 2 is a block diagram illustrating an example semiconductor device module (module 200), according to an implementation. In this example, the module 200 is an implementation of a half-bridge circuit, such as the circuit 100 of FIG. 1. As shown in FIG. 2, the module 200 includes an encapsulated portion 205, a positive power supply terminal 240a, a positive power supply terminal 240b, a negative power supply terminal 250 and an output terminal 260. In some implementations, the encapsulated portion 205 can include a substate on which a power semiconductor circuit, e.g., the half-bridge circuit, is implemented. The substrate, a plurality of semiconductor die and electrical interconnects, such as wire bonds and conductive clips, of the circuit can be encapsulated in a molding compound, such as an epoxy molding compound. The substrate can be a direct-bonded metal (DBM) substrate, such as a direct-bonded copper (DBC) substrate. In some implementations a surface of the substrate can be exposed through the molding compound, e.g., a surface of the substrate opposite that is opposite a surface on which the half-bridge circuit is disposed. The exposed surface can be used to facilitate dissipation of heat generated during operation of the module 200, such as for attachment of a thermal dissipation application (e.g., a heat sink, a fluidic cooling jacket, etc.).

In the example implementation of FIG. 2, a plurality of transistors for implementing the half-bridge circuit can be implemented in the encapsulated portion 205, e.g., on the corresponding substrate. For instance, the module 200 includes a first column of high-side transistors 210a and a second column of high-side transistors 210b. In some implementations, each column of high-side transistors can include a plurality of power transistors, such as vertical IGBTs or vertical MOSFETs. The transistors of the first column of high-side transistors 210a and the transistors of the second column of high-side transistors 210b can coupled in parallel with each other, e.g., via electrical connections on the substrate. That is, the collectors or drains of the high-side transistors can be electrically coupled to a common circuit node that is electrically coupled to the positive power supply terminal 240a and the positive power supply terminal 240b. Further, the emitters or sources of the high-side transistors can be electrically coupled to a common circuit node that is electrically coupled to the output terminal 260. Similarly, the transistors of the first column of low-side transistors 220a and the transistors of the second column of low-side transistors 220b can coupled in parallel with each other, e.g., via electrical connections on the substrate. That is, the collectors or drains of the low-side transistors can be electrically coupled to a common circuit node that is also electrically coupled to the output terminal 260. Further, the emitters or sources of the low-side transistors can be electrically coupled to a common circuit node that is electrically coupled to the negative power supply terminal 250.

As shown in FIG. 2, the positive power supply terminal 240a, the positive power supply terminal 240b and the negative power supply terminal 250 are disposed along a first edge (first side) of the module 200. In the example of FIG. 2, the negative power supply terminal 250 is disposed between the positive power supply terminal 240a and the positive power supply terminal 240b. That is, the positive power supply terminal 240a can be laterally disposed from the negative power supply terminal 250 on a first side of the negative power supply terminal 250, while the positive power supply terminal 240b is laterally disposed from the negative power supply terminal 250 on an opposite side of the negative power supply terminal 250 from the positive power supply terminal 240a.

In some implementations, respective connection tabs (e.g., for attachment to power rails of system including the module 200) can be arranged in a common plane, e.g., can be coplanar with each other. The connection tabs can be respective portions of the terminals that extend out of the encapsulated portion 205. This arrangement allows for mutual interference between respective magnetic fields associated with current $I_p$ (e.g., as shown in FIG. 1) into the module 200 conducted by the positive power supply terminal 240a and the positive power supply terminal 240b and a magnetic field associated with current $I_n$ (e.g., as shown in FIG. 1) out of the module 200. Such an arrangement, as a result of magnetic field cancellation due to this mutual interference, can reduce stray inductance of the module 200 as compared to prior modules with differently arranged power supply terminals (e.g., that do not provide for such cancellation, or have less effective magnetic field cancellation).

In the module 200, the output terminal 260 is disposed on a side (edge) of the encapsulated portion 205 that is opposite from the edge on which the power supply terminals are located. While not shown in FIG. 2, the module 200 can also include one or more signal leads, such as the signal lead 170a and the signal lead 170b of FIG. 1 or other signal leads, such as described herein.

As shown in FIG. 2, in this view, the first column of high-side transistors 210a is arranged on a left side of the encapsulated portion 205 (e.g., on an associated substrate), and the second column of high-side transistors 210b is arranged on a right side of the encapsulated portion 205 (e.g., on the associate substrate). The first column of low-side transistors 220a and the second column of low-side transistors 220b are arranged adjacent to one another and between the columns of high-side transistors. Such an arrangement can be achieved, at least in part, using patterned metal on an associated substrate that is symmetrical (e.g., left-to right symmetrical along a center line C-C) for providing electrical interconnections to the high-side and low-side transistors for implementing a half-bridge circuit. Accordingly, an arrangement of the first column of high-side transistors 210a and the first column of low-side transistors 220a can be symmetrical with an arrangement of the second column of high-side transistors 210b and the second column of low-side transistors 220b. Additional electrical interconnects for implementing the circuit (e.g., the circuit 100) can be made using, e.g., wire bonds, conductive clips, etc. This symmetry in arrangement of the columns of the transistors and the associated patterned metal on the substrate can provide for balancing respective portions of the current $I_p$ conducted by the positive power supply terminal 240a and the positive power supply terminal 240b. This balanced current distribution can improve performance of the module 200 (e.g., electrical efficiency), as well as increase magnetic field cancellation to reduce stray inductance by also balancing the associated magnetic fields.

Figure 4:
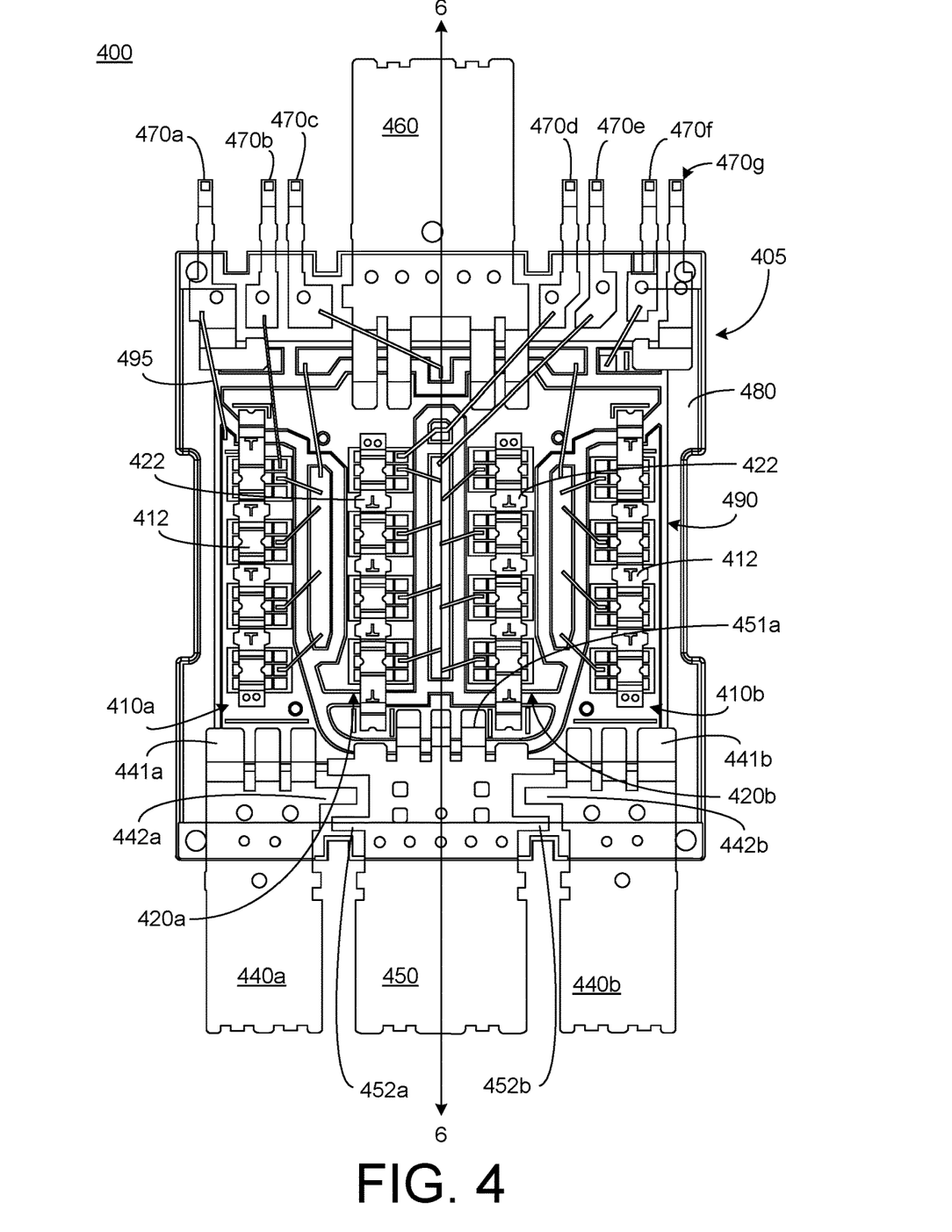
FIG. 4 is a diagram illustrating an example semiconductor device module that can implement the module of FIG. 2.
Figure 6:
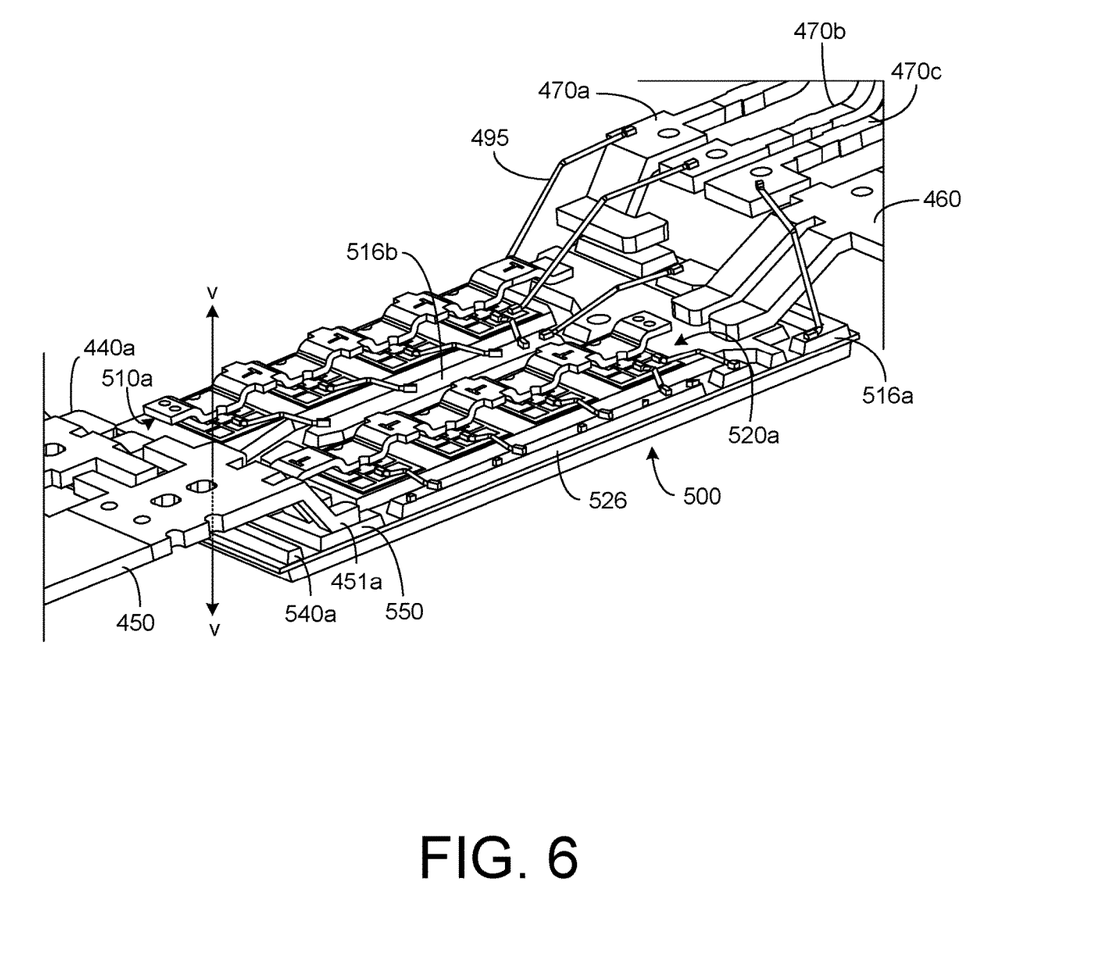
FIG. 6 is a diagram illustrating an isometric view of a cross-section of the module of FIG. 4.
Figure 7:
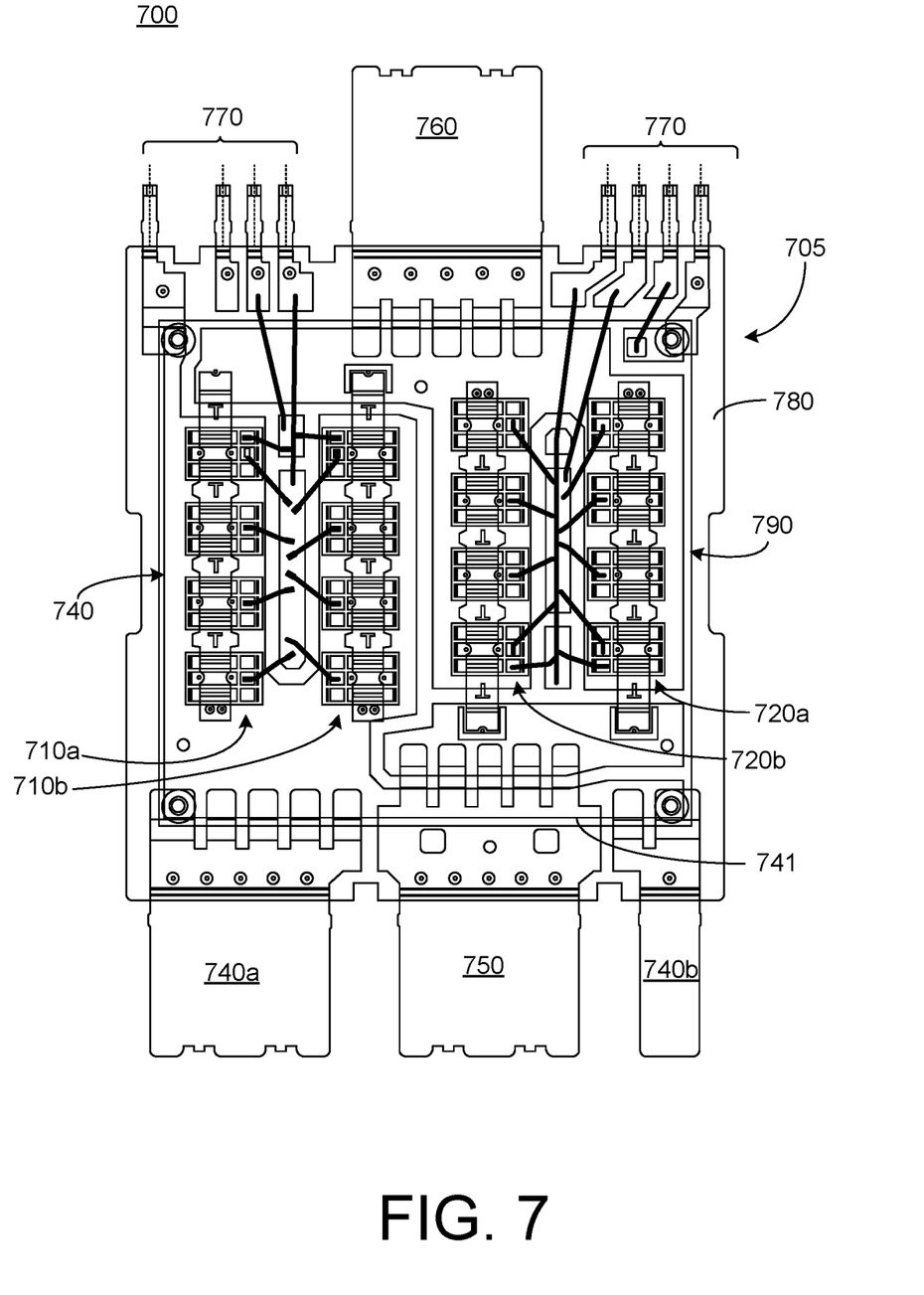
FIG. 7 is a diagram illustrating an example semiconductor device module that can implement the module of FIG. 3.

In the example of FIG. 2, with currents conducted by the positive power supply terminal 240a and the positive power supply terminal 240b being balanced, those terminals can be like sized so that current density in each current path into the module 200 is also balanced. For instance, as shown in FIG. 2, the positive power supply terminal 240a and the positive power supply terminal 240b, as well as the negative power supply terminal 250 can have a same length L measured from the encapsulated portion 205 to respective ends of the terminals (e.g., along respective longitudinal axes extending orthogonally from an edge of the encapsulated portion). As also shown in FIG. 2, the positive power supply terminal 240a and the positive power supply terminal 240b can each have a width of W1 (in a direction parallel with the edge of the encapsulated portion 205), while the negative power supply terminal 250 can have a width of W2, where W2 is greater than W1. In this example, L, W1 and W2 are the dimensions of the portions of the terminals outside the encapsulated portion 205 (e.g., dimensions of the respective connection tabs) and the terminals can extend into the encapsulated portion 205, such as shown in FIGS. 4, 6 and 7. The dimensions of L, W1 and W2 will depend on the particular implementation. In an example implementation, L can be on the order of 17 millimeters (mm), W1 can be on the order of 10.4 mm, and W2 can be on the order of 15 mm. The dimensions of the output terminal 260 will also depend on the particular implementation. In an example implementation, the output terminal 260 can have a length of 13 mm and a width of 14.7.

Figure 3:
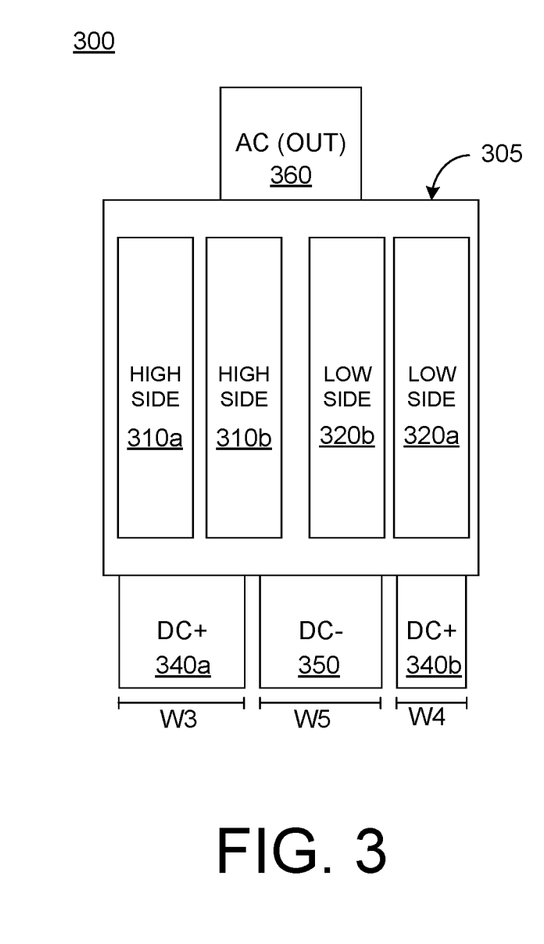
FIG. 3 is a block diagram illustrating another example semiconductor device module, according to an implementation.

FIG. 3 is a block diagram illustrating another example semiconductor device module (module 300), according to an implementation. As with the module 200 of FIG. 2, the module 300 can implement a half-bridge circuit, such as the circuit 100 of FIG. 1. In this example, the module 300 includes aspects similar to the module 200. Accordingly, for purposes of brevity, differences between the module 300 and the module 200 are described, and the similar aspects may not be discussed in detail again with respect to the module 300.

As shown in FIG. 3, the module 300 includes an encapsulated portion 305, a first column of high-side transistors 310a, a second column of high-side transistors 310b, a first column of low-side transistors 320a, a second column of low-side transistors 320b, a positive power supply terminal 340a, a positive power supply terminal 340b, a negative power supply terminal 350, and an output terminal 360. As with the module 200, the module 300 can also include one or more signal leads (not shown).

In the module 300, the first column of high-side transistors 310a and the second column of high-side transistors 310b are disposed adjacent to one another on the left side of a substrate of the encapsulated portion 305 (in the view of FIG. 3), rather than on opposite sides of the substrate as in the module 200. Also, in the module 300, the first column of low-side transistors 320a and the second column of low-side transistors 320b are disposed adjacent to one another on the right side of the substrate, rather than between the columns of high-side transistors as in the module 200. In this arrangement, respective portions of the current $I_p$ conducted by the positive power supply terminal 340a and the positive power supply terminal 340b can differ. For instance, more current may conducted by the positive power supply terminal 340a than the positive power supply terminal 340b due to the arrangement of the columns of transistors and/or electrical resistance of patterned metal on the associated substrate for conducting these portions of the current $I_p$.

Accordingly, in order to balance respective current densities in the positive power supply terminal 340a and the positive power supply terminal 340b, widths of those terminals can be different. For instance, as shown in FIG. 3, the positive power supply terminal 340a has a width of W3 and the positive power supply terminal 340b has a width of W4, which is less than the width W3. As also shown in FIG. 3, the negative power supply terminal 350 has a width of W5 which can be a same width as the width W3, or can be different than the width W3. As with the respective widths of the power supply terminals of the module 200, the respective widths of the power supply terminals of the module 300 will depend on the particular implementation. In an example implementation, the width W3 can be on the order of 15 mm, the width W4 can be on the order of 5 mm, and the width W5 can be on the order of 15 mm. This balancing of current densities in the positive power supply terminal 340a and the positive power supply terminal 340b can improve electrical performance efficiency of the module 300, and also improve magnetic field cancellation to reduce stray inductance, as compared to implementations with unbalanced current densities.

FIG. 4 is a diagram illustrating an example semiconductor device module (module 400) that is an implementation of the module 200 of FIG. 2. As shown in FIG. 4, the module 400 includes an encapsulated portion 405, a first column of high-side transistors 410a, a second column of high-side transistors 410b, a first column of low-side transistors 420a, a second column of low-side transistors 420b, a positive power supply terminal 440a, a positive power supply terminal 440b, a negative power supply terminal 450, and an output terminal 460. The module 400 further includes a plurality of signal leads (470a-470g). A section line 6-6 is also shown FIG. 4, which respectively corresponds with the isometric, cross-sectional view of FIG. 6.

In this example, the encapsulated portion 405 includes an encapsulation material 480, which can be a molding compound (e.g., an epoxy molding compound, etc.), and a substrate assembly 490 on which a half-bridge circuit is implemented using the columns of high-side transistors and columns of low-side transistors. As described herein the encapsulation material 480 can encapsulate the transistors and electrical interconnections (e.g., wire bonds 495, conductive clips 412, and conductive clips 422) between the transistors, the substrate, and the signal leads. In FIG. 4, the encapsulation material 480 is illustrated with transparency to illustrate the structure of the substrate assembly 490 internal to the encapsulation material 480. As was discussed above, in some implementations, a surface of the substrate opposite the surface shown in FIG. 4 can be exposed thorough the encapsulation material 480 to facilitate thermal dissipation for heat generated during electrical operation of the module 400. An example implementation of the substrate assembly 490 is described in further detail below with reference to FIG. 5.

As shown in FIG. 4, the power supply terminals, and the output terminal 460 can be physically and electrically coupled with the substrate assembly 490 using DLA, as discussed above. For instance, the positive power supply terminal 440*a* can be coupled with the substrate via connection leads 441*a*, the positive power supply terminal 440*b* can be coupled with the substrate via connection leads 441*b*, and the negative power supply terminal 450 can be coupled with the substrate via connection leads 451*a*. The connection leads of the power supply terminals (and connection leads of the output terminal 460) can be monolithically formed with their respective terminal, e.g., by forming bent portions of the terminals using stamping, or other metal-working process.

Also, as shown in FIG. 4, one or more signal leads can be physically and electrically coupled to the substrate using DLA, while other signals leads are electrically coupled with the substrate or transistors via wire bonds 495 without being physically coupled to the substrate. As also shown in FIG. 4, each one of the power supply terminals, the output terminal 460 and the signal leads has a portion that is internal to the encapsulation material 480 and a portion that extends outside the encapsulation material 480, e.g., for electrical connection in a corresponding system. As described herein, the portions of the power supply terminals and the output terminal 460 disposed outside the encapsulation material 480 can be referred to as connection tabs or tabs.

In the example of FIG. 4, the negative power supply terminal 450 includes a protrusion 452*a* (or multiple protrusions) that extends towards the positive power supply terminal 440*a*. The negative power supply terminal 450 also includes a protrusion 452*b* (or multiple protrusions) that extends towards the positive power supply terminal 440*b*. Further, the positive power supply terminal 440*a* includes a protrusion 442*a* that extends towards the negative power supply terminal 450 and overlaps with the protrusion 452*a*, and the positive power supply terminal 440*b* includes a protrusion 442*b* that extends towards the negative power supply terminal 450 and overlaps with the protrusion 452*b*. These overlapping protrusions can provide additional magnetic field cancellation and stray inductance reduction resulting from magnetic fields associated with currents in the power supply terminals.

The signal leads of the module 400 include a signal lead 470*a* and a signal lead 470*b*, which can be used for communicating sense signals for the transistors of the half-bridge circuit. For instance, the signal lead 470*a* can be used for a collector or drain sense signal for the high-side transistors, while the signal lead 470*b* can be used for an emitter or source sense signal of the high-side transistor. Accordingly, the signal lead 470*a* and the signal lead 470*b* can be used to determine a current through the parallel connected high-side transistors. The signal leads of the module 400 also include a signal lead 470*c* that can be used for a gate control signal for the high-side transistors, a signal lead 470*d* that can be used for an emitter or source sense signal for the high-side transistors (for determining current in the parallel connected high-side transistors), and a signal lead 470*e* that can be used for a gate control signal for the high-side transistors. The signal leads of the module 400 also include a signal lead 470*f* and a signal lead 470*g* that can be used for temperature sensing (e.g., to determine an internal operating temperature of the module 400).

Figure 5:
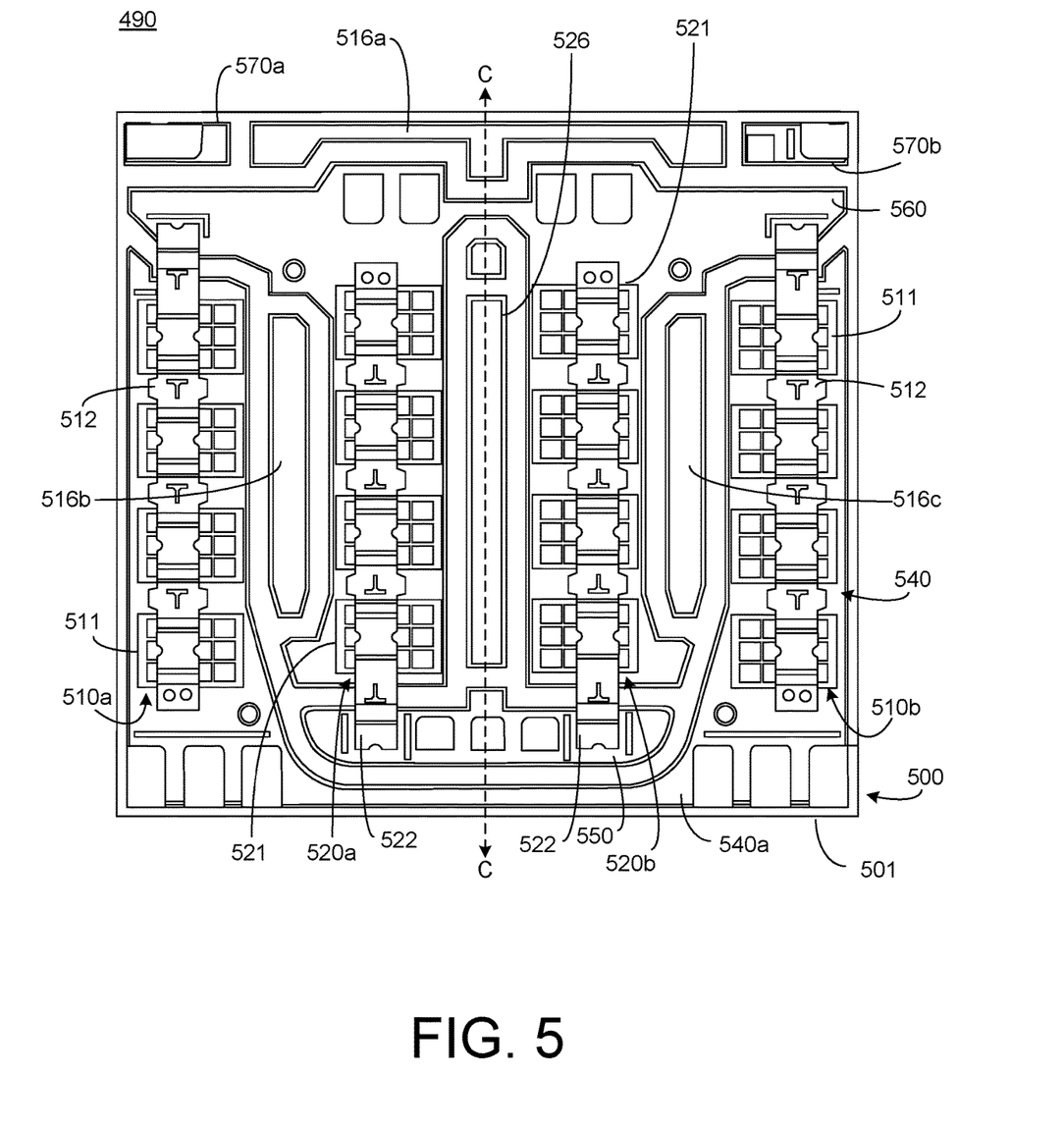
FIG. 5 is a diagram illustrating an example substrate assembly that can be included in the module of FIG. 4.

FIG. 5 is a diagram illustrating a substrate assembly that can be included in the module of FIG. 4, e.g., the substrate assembly 490. Accordingly, FIG. 5 is described with further reference to FIG. 4. As shown in FIG. 5, the substrate assembly 490 includes a substrate 500, which can be a DBM substrate, such as a DBC substrate. The substrate 500 can include a ceramic base layer 501 and a plurality of metal layer portions that are disposed on the ceramic base layer 501. In some implementations, the metal layer portions can be formed (patterned) from a single metal layer, e.g., using a photolithography patterning process, or other process. In some implementations, the metal layer portions can be formed as individual portions, e.g., using one or more deposition processes. The metal layer portions are used for establishing at least some of the electric connections for the half-bridge circuit included on the substrate 500. In some implementations, the substrate 500 can also include a metal layer on a bottom surface of the ceramic base layer 501 (not visible in FIG. 5), where that metal layer facilitates thermal dissipation for the associated module, such as for attachment of a thermal dissipation appliance.

As illustrated in FIG. 5, the substrate assembly 490 includes a first plurality of high-side transistors 511 arranged in a first column 510*a* (on a left side, or along a left edge of the ceramic base layer 501 in the view of FIG. 5), and a second plurality of high-side transistors 511 arranged in a second column 510*b* (on a right side, or along right edge of the ceramic base layer 501). Collector terminals (for IGBTs) or drain terminals (for MOSFETs) of the high-side transistors 511 can be disposed on a metal layer portion 540. The adjoining (intersecting) edges of the substrate 500 can be orthogonal to each other. The metal layer portion 540 can form a common node that is coupled to a DC+supply voltage terminal or terminals, e.g., the positive power supply terminal 440*a* and the positive power supply terminal 440*b* of the module 400.

In this example, the substrate assembly 490 also includes a first plurality of low-side transistors 521 arranged in a first column 520*a*, and a second plurality of low-side transistors 521 arranged in a second column 520*b*. The first column 520*a* and the second column 520*b* can be adjacent to one another (e.g., with an intervening metal layer portion) and disposed between the columns of high-side transistors (e.g., with respective intervening metal layer portions). Collector terminals (for IGBTs) or drain terminals (for MOSFETs) of the low-side transistors 521 can be disposed on a metal layer portion 560. The metal layer portion 560 can form a common node that is coupled to an AC output terminal, e.g., the output terminal 460 of the module 400.

As shown in FIG. 5, conductive clips 512 are used for each column of high-side transistors to electrically couple emitter terminals (for IGBTs) or source terminals (for MOSFETs) for the respective high-side transistors 511 of each column together. The conductive clips 512 are further coupled (electrically and physically) to the metal layer portion 560 to electrically couple the emitter terminals of the high-side transistors 511 of both columns to a common node, e.g., an AC output node. In some implementations, a conductive adhesive, such as solder, can be used to couple the conductive clips 512 with the high-side transistors 511 and the metal layer portion 560. In this example, the conductive clips 512 can be physically coupled with, but electrically insulated from the metal layer portion 540. For instance, an electrically insulative adhesive can be used to physically couple the conductive clips 512 with the metal layer portion 540.

Also, in the substrate assembly 490 of FIG. 5, conductive clips 522 are used for each column of low-side transistors to electrically couple emitter terminals (for IGBTs) or source terminals (for MOSFETs) for the respective low-side transistors 521 of each column together. The conductive clips 522 are further coupled with a metal layer portion 550 to electrically couple the emitter terminals or source terminals of the low-side transistors 521 of both columns to a common node, e.g., an DC− supply terminal, such as the negative power supply terminal 450 of the module 400. In some implementations, a conductive adhesive, such as solder, can be used to couple the conductive clips 522 with the low-side transistors 521 and the metal layer portion 550. In this example, the conductive clips 522 can be physically coupled with, but electrically insulated from the metal layer portion 560. For instance, an electrically insulative adhesive can be used to physically couple the conductive clips 522 with the metal layer portion 560.

In the substrate assembly 490, substrate 500 has a metal portion 516a, a metal layer portion 516b, and a metal layer portion 516c disposed on the ceramic base layer 501. These metal layer portions can be used, in conjunction with corresponding wires bonds, such as shown in FIG. 4, for providing a gate control signal (e.g., from the signal lead 470c of the module 400) to gate terminals of the high-side transistors 511. The substrate 500 of the substrate assembly 490 also has a metal portion 526 disposed on the ceramic base layer 501. The metal portion 526 can be used, in conjunction with corresponding wire bonds, such as shown in FIG. 4, for providing a gate control signal (e.g., from the signal lead 470e of the module 400) to gate terminals of the low-side transistors 521. In the substrate assembly 490, a metal layer portion 570a and a metal layer portion 570b are also disposed on the ceramic base layer 501 of the substrate 500. As shown in FIG. 4, the metal layer portion 570a can be used for DLA of the signal lead 470a, and the metal layer portion 570b can be used for DLA of the signal lead 470g. Additional electrical interconnections for the half-bridge circuit of the substrate assembly 490 shown in FIG. 5 can be made using wire bonds, such as the wire bonds 495 shown in FIG. 4.

As shown in FIG. 5, the metal layer portion 540 includes a sub-portion 540a that extends between a part of the metal layer portion 540 on a left side of the ceramic base layer 501 to a part of the metal layer portion 540 on a right side of the ceramic base layer 501, where the metal layer portion 540, including the sub-portion 540a is electrically continuous. As illustrated in FIG. 5 with further reference to FIG. 4, the sub-portion 540a is arranged such that is passes under the output terminal 460. That is, the sub-portion 540a is arranged such that it overlaps, at least in part, with the output terminal 460. This arrangement can facilitate current balance between the positive power supply terminal 440a and the positive power supply terminal 440b of the module 400, as well as provide additional magnetic field cancellation (e.g., due to the overlap between the output terminal 460 and the sub-portion 540a) to reduce stray inductance.

FIG. 6 is a diagram illustrating an isometric view of a cross-section of the module of FIG. 4. The cross-section of the module 400 shown FIG. 6 is along the section line 6-6 in FIG. 4. Reference numbers for elements of FIG. 4 and FIG. 5 are included in FIG. 6 for purposes of context, though each of those elements is not described in detail again here with respect to FIG. 6. Also, in the view of FIG. 6, the entireties of the positive power supply terminal 440a, the negative power supply terminal 450, the output terminal 460, the signal lead 470a, the signal lead 470b, and the signal lead 470c are not shown. Other portions of the module 400 are not shown in FIG. 4, as they are removed from the illustrated sectional view.

As can be seen in FIG. 6, the negative power supply terminal 450 is coupled to the metal layer portion 550, e.g., by DLA, via connection leads 451a. As described herein, such connection leads can be formed using a stamping, or other metal working process, by bending a portion of the corresponding terminal, e.g., the negative power supply terminal 450 to form the connection leads 451a. In this arrangement, a portion of the negative power supply terminal 450 including a connection tab can be arranged in a first plane, where that first plane is parallel with, but non-coplanar with a second plane in which the substrate 500 is arranged, e.g., a plane in which the connection leads 451a are attached to the metal layer portion 550. Accordingly, as is shown in FIG. 1, the first plane is separated from the second plane, allowing the sub-portion 540a to pass under the negative power supply terminal 450 to create overlap between the sub-portion 540a and the negative power supply terminal 450. That is, as shown in FIG. 6, a vertical line V-V (orthogonal to a plane of the connection tab and orthogonal to a plane of the substrate) that extends through the negative power supply terminal 450 in the first plane and through the sub-portion 540a in the second plane will intersect both the negative power supply terminal 450 and the sub-portion 540a.

FIG. 7 is a diagram illustrating an example semiconductor device module (module 700) that is an implementation of the module 300 of FIG. 3. As shown in FIG. 7, the module 700 includes an encapsulated portion 705, a first column of high-side transistors 710a, a second column of high-side transistors 710b, a first column of low-side transistors 720a, a second column of low-side transistors 720b, a positive power supply terminal 740a, a positive power supply terminal 740b, a negative power supply terminal 750, and an output terminal 760. The module 700 further includes signal leads 770, which can be used to communicate signals, such as those described with respect to FIG. 4.

In this example, the encapsulated portion 705 includes an encapsulation material 780, which can be a molding compound (e.g., an epoxy molding compound, etc.), and a substrate assembly 790 on which a half-bridge circuit is implemented using the columns of high-side transistors and the columns of low-side transistors. The encapsulation material 780 can encapsulate the transistors and electrical interconnections (e.g., wire bonds and conductive clips) between the transistors, the substrate, and the signal leads, similar to the encapsulation material 480 of the module 400. In FIG. 7, as with the encapsulation material 480, the encapsulation material 780 is illustrated with transparency to illustrate the structure of the substrate assembly 790 internal to the encapsulation material 780. In some implementations, a surface of the substrate of the substrate assembly 790 opposite the surface shown in FIG. 7 can be exposed thorough the encapsulation material 780 to facilitate thermal dissipation for heat generated during electrical operation of the module 700. Electrical connections for implementing the half-bridge circuit of FIG. 7 can be made using similar approaches as described above for the module 400 (with respect to FIG. 4) and the substrate assembly 490 (with respect to FIG. 5). Accordingly, for purposes of brevity, those details are not described again with respect to FIG. 7.

As illustrated in FIG. 7, the substrate assembly 790 includes a first plurality of a first column of high-side transistors 710a (on a left side of the substrate assembly 790 in the view of FIG. 7), and a second column of high-side transistors 710b arranged (adjacent to the first column of high-side transistors 710a with an intervening metal layer portion). The substrate assembly 790 also includes a first column of low-side transistors 720a, and a second column of low-side transistors 720b. The first column of low-side transistors 720a is adjacent to the second column of high-side transistors 710b (with an intervening metal layer portion), and the first column of low-side transistors 720a is arranged along a right side of the substrate assembly 790, adjacent to the second column of low-side transistors 720b (with an intervening metal layer portion). The high-side transistors can be coupled in parallel with each other, and the low-side transistors can be coupled in parallel with each other, such as by using approaches such as those described herein.

As shown in FIG. 7, the metal layer portion 740 includes a sub-portion 741 that extends between a part of the metal layer portion 740 on a left side of the ceramic base layer 501 to an attachment pad for the positive power supply terminal 740b. As compared to the module 400 and the substrate assembly 490, in the module 700, both columns of the high-side transistors are arranged on the left side of the substrate assembly 790, while both columns of low-side transistors are arranged on the right side of the substrate assembly 790. As a result, this can limit available space for metal layer routing from the positive power supply terminal 740b. As a result, in this example arrangement, the sub-portion 741, due to its electrical resistance, can result in portions of the current Ip (as described with respect to FIG. 1) respectively conducted by the positive power supply terminal 740a and the positive power supply terminal 740b being imbalanced. That is, the portion of the current $I_p$ conducted by the positive power supply terminal 740b can be less than the portion of the current $I_p$ conducted by the positive power supply terminal 740a. In order to balance the current densities and corresponding magnetic field between the positive power supply terminal 740a and the positive power supply terminal 740b, the positive power supply terminal 740b can have a narrower width (e.g., the width W4 of the positive power supply terminal 340b of FIG. 3) than a width of the positive power supply terminal 740a (e.g., the width W3 of the positive power supply terminal 340a of FIG. 3).

As illustrated in FIG. 7, similar to the sub-portion 540a of FIG. 5, the sub-portion 741 is arranged such that is passes under the output terminal 760. That is, the sub-portion 741 is arranged such that it overlaps, at least in part, with the output terminal 760. This arrangement can facilitate current balance between the positive power supply terminal 740a and the positive power supply terminal 740b of the module 700, as well as provide additional magnetic field cancellation (e.g., due to the overlap between the output terminal 760 and the sub-portion 741) to reduce stray inductance.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A module comprising:
a substrate having a semiconductor circuit implemented thereon;
a negative power supply terminal electrically coupled with the semiconductor circuit via the substrate, the negative power supply terminal having a connection tab arranged in a first plane;
a first positive power supply terminal electrically coupled with the semiconductor circuit via the substrate, the first positive power supply terminal being laterally disposed from the negative power supply terminal, the first positive power supply terminal having a connection tab arranged in the first plane; and
a second positive power supply terminal electrically coupled with the semiconductor circuit via the substrate, the second positive power supply terminal being laterally disposed from the negative power supply terminal, the second positive power supply terminal being arranged in the first plane, the negative power supply terminal being disposed between the first positive power supply terminal and the second positive power supply terminal, the negative power supply terminal including a protrusion extending toward the first positive power supply terminal, and the first positive power supply terminal includes a protrusion extending toward the negative power supply terminal that is parallel and coplanar with the protrusion of the negative power supply terminal.

2. The module of claim 1, wherein the first positive power supply terminal and the second positive power supply terminal are electrically coupled with the semiconductor circuit via a patterned metal layer disposed on a surface of the substrate, the patterned metal layer including a portion electrically coupling the first positive power supply terminal with the second positive power supply terminal, the surface of the substrate defining a second plane that is parallel to and non-coplanar with the first plane.

3. The module of claim 1, wherein the connection tab of the negative power supply terminal, the connection tab of the first positive power supply terminal and the connection tab of the second positive power supply terminal are disposed external to an encapsulation material of the module along a same edge of the module, the encapsulation material encapsulating the semiconductor circuit and at least a portion of the substrate.

4. The module of claim 1, wherein:
the semiconductor circuit is a half-bridge circuit;
the negative power supply terminal is electrically coupled with a low-side switch of the half-bridge circuit; and
the first positive power supply terminal and the second positive power supply terminal are electrically coupled in parallel with each other and electrically coupled with a high-side switch of the half-bridge circuit.

5. The module of claim 1, further comprising:
an encapsulation material that encapsulates the semiconductor circuit and encapsulates at least a portion of the substrate,
the connection tab of the negative power supply terminal, the connection tab of the first positive power supply terminal and the connection tab of the second positive power supply terminal each extending out of the encapsulation material along respective longitudinal axes that are orthogonal to a same edge of the encapsulation material,
the connection tab of the negative power supply terminal having a first width along a line orthogonal to the respective longitudinal axis of the negative power supply terminal; and
the connection tab of the first positive power supply terminal and the connection tab of the second positive power supply terminal each having a second width along a line orthogonal to their respective longitudinal axes, the second width being less than the first width.

6. The module of claim 1, further comprising:
an encapsulation material that encapsulates the semiconductor circuit and encapsulates at least a portion of the substrate,
the connection tab of the negative power supply terminal, the connection tab of the first positive power supply terminal and the connection tab of the second positive power supply terminal each extending out of the encapsulation material along respective longitudinal axes that are orthogonal to a same edge of the encapsulation material, the connection tab of the negative power supply terminal having a first width along a line orthogonal to the respective longitudinal axis of the negative power supply terminal;
the connection tab of the first positive power supply terminal having a second width along a line orthogonal to its respective longitudinal axis, the second width being less than the first width.

7. The module of claim 1, wherein the connection tab of the negative power supply terminal, the connection tab of the first positive power supply terminal and the connection tab of the second positive power supply terminal are disposed along a first edge of the module,
module further comprising an output terminal electrically coupled with the semiconductor circuit via the substrate, the output terminal having a connection tab arranged in the first plane, the connection tab of the output terminal being disposed along a second edge of the module opposite the first edge.

8. The module of claim 1, wherein the substrate is a direct-bonded-metal substrate.

9. The module of claim 1, wherein:
the protrusion of the negative power supply terminal is a first protrusion of the negative power supply terminal;
the negative power supply terminal further includes a second protrusion extending toward the second positive power supply terminal; and
the second positive power supply terminal includes a protrusion extending toward the negative power supply terminal that is parallel and coplanar with the second protrusion of the negative power supply terminal.

10. The module of claim 2, wherein a line orthogonal to the first plane and the second plane intersects the negative power supply terminal and the portion of the portion of the patterned metal layer electrically coupling the first positive power supply terminal with the second positive power supply terminal.

11. The module of claim 4, wherein:
the low-side switch includes a first plurality of power transistors electrically coupled in parallel with each other; and
the high-side switch includes a second plurality of power transistors electrically coupled in parallel with each other.

12. The module of claim 7, wherein:
the semiconductor circuit is a half-bridge circuit; and
the output terminal is electrically coupled with an output node of the half-bridge circuit.

13. A module comprising:
a substrate having a half-bridge circuit implemented thereon, the half-bridge circuit including:
a plurality of high-side power semiconductor switches electrically coupled in parallel; and
a plurality of low-side power semiconductor switches electrically coupled in parallel;
a negative power supply terminal electrically coupled with the plurality of low-side power semiconductor switches, the negative power supply terminal having a connection tab arranged in a first plane;
a first positive power supply terminal electrically coupled with the plurality of high-side power semiconductor switches, the first positive power supply terminal being laterally disposed from the negative power supply terminal along a first edge of the substrate, the first positive power supply terminal having a connection tab arranged in the first plane; and a second positive power supply terminal electrically coupled with the plurality of high-side power semiconductor switches, the second positive power supply terminal being laterally disposed from the negative power supply terminal on the first edge of the substrate, the second positive power supply terminal being arranged in the first plane, the negative power supply terminal being disposed between the first positive power supply terminal and the second positive power supply terminal, the plurality of high-side power semiconductor switches including in a column of high-side power semiconductor switches arranged along a third edge of the substrate, the third edge of the substrate being orthogonal to the first edge of the substrate, and the plurality of low-side power semiconductor switches including a column of low-side power semiconductor switches arranged in parallel with and adjacent to the column of high-side switches.

14. The module of claim 13, wherein:

the first positive power supply terminal and the second positive power supply terminal are electrically coupled with the plurality of high-side power semiconductor switches via a patterned metal layer disposed on a surface of the substrate;

the patterned metal layer includes a portion electrically coupling the first positive power supply terminal with the second positive power supply terminal, the surface of the substrate defining a second plane that is parallel to and non-coplanar with the first plane; and a line orthogonal to the first plane and the second plane intersects the negative power supply terminal and the portion of the portion of the patterned metal layer electrically coupling the first positive power supply terminal with the second positive power supply terminal.

15. The module of claim 13, further comprising an output terminal electrically coupled with an output node of the half-bridge circuit, the output terminal having a connection tab arranged in the first plane, the connection tab of the output terminal being disposed along a second edge of the substrate opposite the first edge.

16. The module of claim 13, wherein the substrate includes a patterned metal layer of the half-bridge circuit, the patterned metal layer being symmetric along a center line of the substrate extending from the first edge of the substrate to a second edge of the substrate, opposite the first edge.

17. The module of claim 13, wherein:

the plurality of high-side power semiconductor switches are arranged in:
 a first column of high-side power semiconductor switches arranged along a third edge of the substrate, the third edge of the substrate being orthogonal to the first edge of the substrate and a second edge of the substrate opposite the first edge of the substrate; and
 a second column of high-side power semiconductor switches arranged along a fourth edge of the substrate, the fourth edge of the substrate being orthogonal to the first edge and the second edge of the substrate; and the plurality of low-side power semiconductor switches are arranged in:
 a first column of low-side power semiconductor switches arranged in parallel with and adjacent to the first column of high-side switches; and
 a second column of low-side power semiconductor switches arranged in parallel with and disposed between the first column of low-side switches and the second column of high-side switches.

18. The module of claim 13, wherein:

the negative power supply terminal includes:
 a first protrusion extending toward the first positive power supply terminal;
 a second protrusion extending toward the second positive power supply terminal;

the first positive power supply terminal includes a protrusion extending toward the negative power supply terminal that is parallel and coplanar with the first protrusion of the negative power supply terminal; and the second positive power supply terminal includes a protrusion extending toward the negative power supply terminal that is parallel and coplanar with the second protrusion of the negative power supply terminal.

19. The module of claim 17, wherein an arrangement of the first column of high-side power semiconductor switches and the first column of low-side power semiconductor switches is symmetrical with an arrangement of the second column of high-side power semiconductor switches and the second column of low-side semiconductor switches.

20. A module comprising:

a substrate having a half-bridge circuit implemented thereon, the half-bridge circuit including:
 a plurality of high-side power semiconductor switches electrically coupled in parallel
 a plurality of low-side power semiconductor switches electrically coupled in parallel,;

a negative power supply terminal electrically coupled with the plurality of low-side power semiconductor switches, the negative power supply terminal having a connection tab arranged in a first plane;

a first positive power supply terminal electrically coupled with the plurality of high-side power semiconductor switches, the first positive power supply terminal being laterally disposed from the negative power supply terminal along a first edge of the substrate, the first positive power supply terminal having a connection tab arranged in the first plane; and a second positive power supply terminal electrically coupled with the plurality of high-side power semiconductor switches, the second positive power supply terminal being laterally disposed from the negative power supply terminal on the first edge of the substrate, the second positive power supply terminal being arranged in the first plane, the negative power supply terminal being disposed between the first positive power supply terminal and the second positive power supply terminal, the plurality of high-side power semiconductor switches including a first column of high-side power semiconductor switches arranged along a third edge of the substrate, the third edge of the substrate being orthogonal to the first edge of the substrate and a second edge of the substrate opposite the first edge, and the plurality of low-side power semiconductor switches including a first column of low-side power semiconductor switches arranged along a fourth edge of the substrate, the fourth edge of the substrate being orthogonal to the first edge and the second edge of the substrate.

21. The module of claim 20, wherein:

the plurality of high-side power semiconductor switches further includes a second column of high-side power semiconductor switches arranged in parallel with and adjacent to the first column of high-side power semiconductor switches; and the plurality of low-side power semiconductor switches further includes a second column of low-side power semiconductor switches arranged in parallel with and disposed between the first column of low-side switches and the second column of high-side switches.

\* \* \* \* \*